United States Patent
Degawa

(10) Patent No.: US 10,756,257 B2
(45) Date of Patent: Aug. 25, 2020

(54) MAGNETORESISTANCE EFFECT DEVICE

(71) Applicant: TDK CORPORATION, Tokyo (JP)

(72) Inventor: Naomichi Degawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/364,865

(22) Filed: Mar. 26, 2019

(65) Prior Publication Data

US 2019/0305215 A1    Oct. 3, 2019

(30) Foreign Application Priority Data

Mar. 30, 2018   (JP) .................. 2018-069965

(51) Int. Cl.
   *H01L 43/08*   (2006.01)
   *G01R 33/09*   (2006.01)
   *H01L 43/02*   (2006.01)
   *H01L 43/10*   (2006.01)

(52) U.S. Cl.
   CPC .............. *H01L 43/08* (2013.01); *G01R 33/09* (2013.01); *H01L 43/02* (2013.01); *H01L 43/10* (2013.01)

(58) Field of Classification Search
   CPC ......... H01L 43/08; H01L 43/10; H01L 43/02; G01R 33/09; G01R 33/093; G01R 33/098
   See application file for complete search history.

(56) References Cited

U.S. PATENT DOCUMENTS

| 6,466,419 B1 | 10/2002 | Mao |
| 6,603,641 B1 | 8/2003 | Sasaki |
| 6,700,760 B1 | 3/2004 | Mao |
| 7,280,325 B1 | 10/2007 | Pan |

(Continued)

FOREIGN PATENT DOCUMENTS

| JP | 2017-063397 A | 3/2017 |
| JP | 2017-153066 A | 8/2017 |
| WO | 2007/032149 A1 | 3/2007 |

OTHER PUBLICATIONS

Konishi, K. et al., "Radio-Frequency Amplification Property of the MGO-Based Magnetic Tunnel Junction Using Field-Induced Ferromagnetic Resonance", Appl. Phys. Lett., vol. 102, pp. 162409-1-162409-4, (2013).

(Continued)

*Primary Examiner* — Syed I Gheyas
(74) *Attorney, Agent, or Firm* — Oliff PLC

(57) ABSTRACT

Provided is a magnetoresistance effect device comprising a magnetoresistance effect element including a first ferromagnetic layer, a second ferromagnetic layer and a spacer layer and a high-frequency signal line. The high-frequency signal line includes an overlapping part disposed at a position overlapping the magnetoresistance effect element and a non-overlapping part disposed at a position not overlapping the magnetoresistance effect element in a plan view from a stacking direction. At least a part of the non-overlapping part is formed to be thicker than at least a part of the overlapping part. A distance in the stacking direction between a virtual plane including a surface on the side of the overlapping part of the first ferromagnetic layer and a center line in the high-frequency signal line in the stacking direction is shorter in at least a part of the overlapping part than in at least a part of the non-overlapping part.

6 Claims, 6 Drawing Sheets

(56) References Cited

U.S. PATENT DOCUMENTS

| | | | |
|---|---|---|---|
| 2005/0219768 A1* | 10/2005 | Nakamura | G11B 5/39 360/324.1 |
| 2009/0168501 A1* | 7/2009 | Ito | G11C 11/1659 365/158 |
| 2009/0185315 A1 | 7/2009 | Xue et al. | |
| 2010/0232072 A1 | 9/2010 | Dimitrov et al. | |
| 2010/0276791 A1 | 11/2010 | Kaneko et al. | |
| 2016/0277000 A1* | 9/2016 | Shibata | H04L 43/08 |
| 2017/0244377 A1 | 8/2017 | Yamane et al. | |
| 2018/0316077 A1 | 11/2018 | Yamane et al. | |
| 2019/0044500 A1 | 2/2019 | Degawa et al. | |
| 2019/0180901 A1 | 6/2019 | Kaizu et al. | |
| 2019/0304491 A1 | 10/2019 | Degawa et al. | |
| 2019/0305215 A1 | 10/2019 | Degawa | |

OTHER PUBLICATIONS

Nov. 6, 2019 Office Action Issued in U.S. Appl. No. 16/208,191.
Sep. 30, 2019 Office Action issued in U.S. Appl. No. 16/364,534.
Mar. 11, 2020 Office Action Issued in U.S. Appl. No. 16/364,534.
A. A. Tulapurkar et al., "Spin-Torque Diode Effect in Magnetic Tunnel Junctions", Nature, vol. 438, No. 7066, pp. 339-342, Nov. 17, 2005.

* cited by examiner

MAGNETORESISTANCE EFFECT DEVICE

CROSS-REFERENCE TO RELATED APPLICATION

Priority is claimed on Japanese Patent Application No. 2018-069965, filed Mar. 30, 2018, the content of which is incorporated herein by reference.

BACKGROUND

The present disclosure relates to a magnetoresistance effect device using a magnetoresistance effect element.

In recent years, the speed of wireless communication has increased as mobile communication terminals such as cellular phones have become more sophisticated. Since the communication speed is proportional to the bandwidth of the frequency used, the frequency band required for communication has increased, and along with this, the number of high-frequency filters required for mobile communication terminals has also increased. Research on the field of spintronics, which is expected to be applied to new parts for use with high frequencies, has been actively conducted. One of the phenomena attracting attention regarding this is a spin torque resonance phenomenon of a magnetoresistance effect element (see e.g., Nature, Vol. 438, No. 7066, pp. 339-342, 17 Nov. 2005).

For example, by applying a static magnetic field to a magnetoresistance effect element using a magnetic field applying unit while causing an alternating current to flow through the magnetoresistance effect element, ferromagnetic resonance can be caused in the magnetization of a magnetization free layer included in the magnetoresistance effect element, and the resistance of the magnetoresistance effect element oscillates periodically at a frequency corresponding to the ferromagnetic resonance frequency. The resistance of the magnetoresistance effect element also oscillates likewise when applying a high-frequency magnetic field to the magnetization free layer of the magnetoresistance effect element. The ferromagnetic resonance frequency varies depending on the strength of the static magnetic field applied to the magnetoresistance effect element and is generally included in a high-frequency band of several to several tens of GHz.

A Patent Document discloses a technique of changing the ferromagnetic resonance frequency by changing the strength of a static magnetic field applied to a magnetoresistance effect element and suggests a device such as a high-frequency filter using this technique (see e.g., Japanese Unexamined Patent Application, First Publication No. 2017-153066).

The Patent Document discloses that a high-frequency current flows through a high-frequency signal line and a high-frequency magnetic field generated from the high-frequency signal line is applied to a magnetoresistance effect element. However, in the configuration of the high-frequency signal line disclosed, the strength of the high-frequency magnetic field applied to the magnetoresistance effect element may be insufficient.

FIG. 1A and FIG. 1B are cross-sectional view schematically showing a configuration in the vicinity of a magnetoresistance effect element.

A magnetoresistance effect device 10 shown in FIG. 1A includes a magnetoresistance effect element 101 (MR element), a high-frequency signal line 3, a first electrode wiring 7, and a second electrode wiring 8. A magnetoresistance effect element 101 includes a first ferromagnetic layer 101A, a second ferromagnetic layer 101B and a spacer layer 101C (such as a nonmagnetic layer). The first ferromagnetic layer 101A, the second ferromagnetic layer 101B and the spacer layer 101C are stacked such that the spacer layer 101C is disposed between the first ferromagnetic layer 101A and the second ferromagnetic layer 101B. The arrow with a reference numeral L indicates a direction in which such layers are stacked.

Here, the first electrode wiring 107 and the second electrode wiring 108 are lines provided at an upper end and a lower end of an element in order to apply a current or a voltage to a magnetoresistance effect element or to transmit a signal output from a magnetoresistance effect element (electrodes may be provided at an upper end and a lower end of a magnetoresistance effect element in order to increase conductivity and the like, and the line including the electrodes will be referred to as an "electrode wiring" below).

A dotted line $X_0$ in the high-frequency signal line 3 indicates a center line of the high-frequency signal line 3 in a stacking direction of the magnetoresistance effect element 101. The center line refers to a line bisecting the high-frequency signal line 3 in the stacking direction (that is, the thickness direction).

One reason for the strength of a high-frequency magnetic field applied to a magnetoresistance effect element being insufficient is that a distance $D_0$ between the magnetoresistance effect element 101 and the center line $X_0$ in the high-frequency signal line 3 in the stacking direction is large.

Here, in order to increase the high-frequency magnetic field applied to the magnetoresistance effect element 101, as shown in FIG. 1B, the high-frequency signal line 3 is formed to be thinner, and thus the distance $D_0$ between the magnetoresistance effect element 101 and the center line $X_0$ in the high-frequency signal line 3 in the stacking direction is suitably shortened. However, since the electrical resistance (hereinafter simply referred to as "resistance") is inversely proportional to a cross-sectional area, when the high-frequency signal line 3 is made thinner, the resistance of the high-frequency signal line 3 becomes larger and high-frequency characteristics deteriorate.

It is desirable to provide a magnetoresistance effect device through which it is possible to increase the strength of a magnetic field applied to a magnetoresistance effect element and also reduce the resistance of a high-frequency signal line.

SUMMARY

The present disclosure provides the following aspects.

A magnetoresistance effect device according to first aspect of the present disclosure includes a magnetoresistance effect element including a first ferromagnetic layer, a second ferromagnetic layer and a spacer layer; and a high-frequency signal line, wherein in the magnetoresistance effect element, the first ferromagnetic layer, the second ferromagnetic layer, and the spacer layer are stacked such that the spacer layer is disposed between the first ferromagnetic layer and the second ferromagnetic layer, the high-frequency signal line includes an overlapping part disposed at a position overlapping the magnetoresistance effect element and a non-overlapping part disposed at a position not overlapping the magnetoresistance effect element in a plan view from a stacking direction, at least a part of the non-overlapping part is formed to be thicker than at least a part of the overlapping part, and a distance in the stacking direction between a virtual plane including a surface on the side of the overlapping part of the first ferromagnetic layer and a center line in the high-frequency signal line in the stacking direction is shorter in at least a part of the overlapping part than in at least a part of the non-overlapping part.

A magnetoresistance effect device according to a second aspect of the present invention includes a magnetoresistance effect element including a first ferromagnetic layer, a second ferromagnetic layer and a spacer layer; and a high-frequency signal line, wherein in the magnetoresistance effect element, the first ferromagnetic layer, the second ferromagnetic layer, and the spacer layer are stacked such that the spacer layer is disposed between the first ferromagnetic layer and the second ferromagnetic layer, the high-frequency signal line includes an overlapping part disposed at a position overlapping the magnetoresistance effect element and a non-overlapping part disposed at a position not overlapping the magnetoresistance effect element in a plan view from a stacking direction, at least a part of the non-overlapping part is formed to be thicker than at least a part of the overlapping part, and the high-frequency signal line has, at at least a part of the non-overlapping part, a protrusion that protrudes to a level above at least a part of the overlapping part in the stacking direction, assuming that the overlapping part is positioned above the magnetoresistance effect element in the stacking direction.

DETAILED DESCRIPTION

Figure 1A:
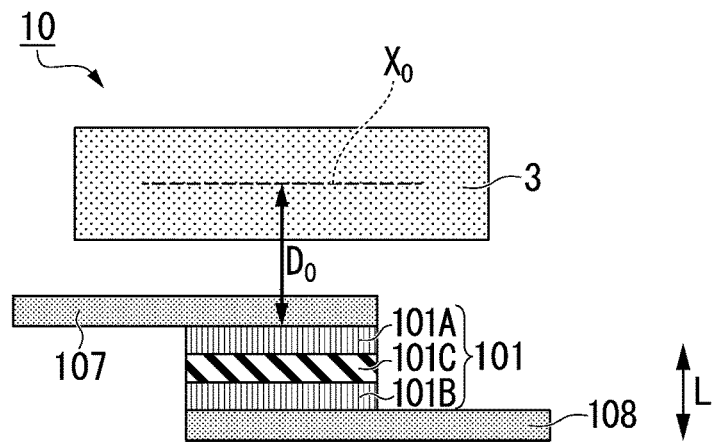
FIG. 1A is a cross-sectional view schematically showing a configuration in the vicinity of a magnetoresistance effect element.

The present disclosure will be appropriately described below in detail with reference to the drawings. In the drawings used in the following description, in order to facilitate understanding of features of the present disclosure, feature parts are enlarged for convenience of illustration in some cases, and dimensional proportions and the like of components may be different from those of actual components. Materials, sizes, and the like in the following description are exemplary examples, the present disclosure is not limited thereto, and they can be appropriately changed within a range in which effects of the present disclosure are obtained.

First Embodiment

Figure 2:
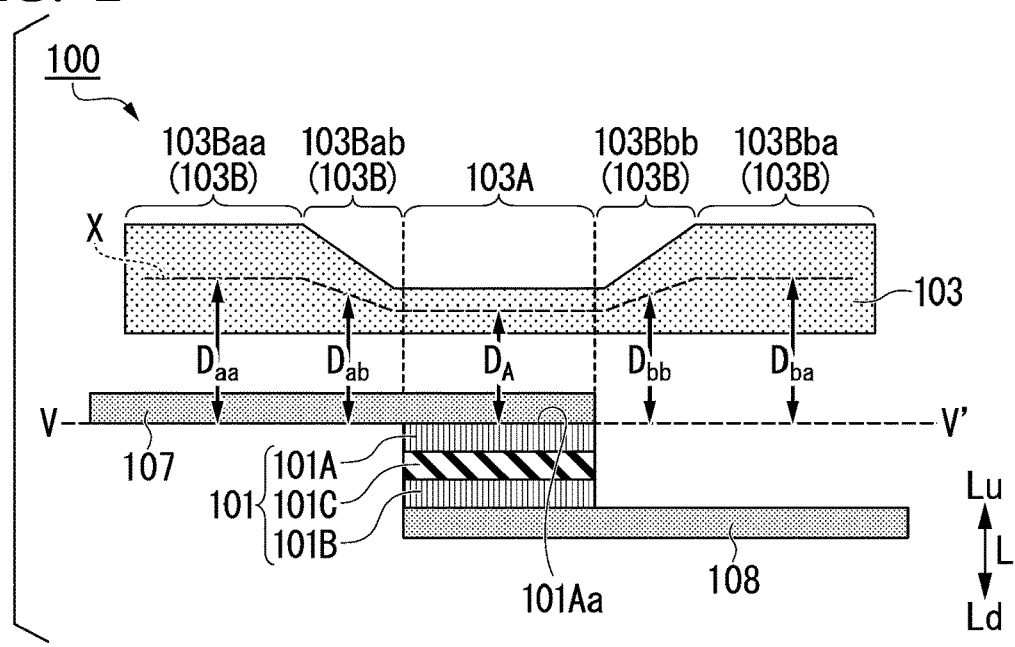
FIG. 2 is a cross-sectional view schematically showing an exemplary configuration of a magnetoresistance effect device 100 according to a first embodiment of the present disclosure.

FIG. 2 is a cross-sectional view schematically showing an exemplary configuration of a magnetoresistance effect device 100 according to a first embodiment of the present disclosure.

The magnetoresistance effect device 100 includes at least a magnetoresistance effect element (MR element) 101 and a high-frequency signal line 103. In the magnetoresistance effect device 100, a magnetic field (a high-frequency magnetic field) generated from the high-frequency signal line 103 when a high-frequency current flows through the high-frequency signal line 103 and a magnetic field (a static magnetic field) generated from a magnetic field applying unit (not shown) (for example, a magnetic member) are applied to the magnetoresistance effect element 101.

In FIG. 2, a direction in which layers constituting a magnetoresistance effect element are stacked is defined as L, and in that direction, a direction toward the upper side in the drawing (a direction from a second ferromagnetic layer 101B toward a first ferromagnetic layer 101A) is defined as Lu, and a direction toward the lower side in the drawing (a direction from the first ferromagnetic layer 101A toward the second ferromagnetic layer 101B) is defined as Ld.

<Magnetoresistance Effect Element>

The magnetoresistance effect element 101 includes a first ferromagnetic layer 101A, a second ferromagnetic layer 101B and a spacer layer 101C (such as a nonmagnetic layer). The first ferromagnetic layer 101A, the second ferromagnetic layer 101B and the spacer layer 101C are stacked such that the spacer layer 101C is disposed between the first ferromagnetic layer 101A and the second ferromagnetic layer 101B. For example, the first ferromagnetic layer 101A functions as a magnetization free layer, and the second ferromagnetic layer 101B functions as a magnetization fixed layer. In this case, a magnetization direction of the magnetization free layer changes relative to a magnetization direction of the magnetization fixed layer. The first ferromagnetic layer 101A and the second ferromagnetic layer 101B have different coercivites, and the coercivity of a layer functioning as the magnetization fixed layer is larger than the coercivity of a layer functioning as the magnetization free layer. The thickness of each of the first ferromagnetic layer 101A and the second ferromagnetic layer 101B is preferably about 1 to 10 nm.

The first ferromagnetic layer 101A and the second ferromagnetic layer 101B are made of a known ferromagnetic material, for example, a metal such as Cr, Mn, Co, Fe, and Ni, and a material selected from among ferromagnetic alloys containing one or more of such metals so that they have different coercivites. In addition, each of the first ferromagnetic layer 101A and the second ferromagnetic layer 101B may be made of an alloy containing such metals and at least one of B, C, and N (specifically, Co—Fe or Co—Fe—B).

In addition, in order to obtain a higher output, a Heusler alloy such as $Co_2FeSi$ is preferably used. A Heusler alloy contains an intermetallic compound having a chemical composition of $X_2YZ$. X is a transition metal element from the Co, Fe, Ni, or Cu groups or a noble metal element in the periodic table, Y is a transition metal from the Mn, V, Cr or Ti groups or the same elements as for X, and Z is a typical element of Group III to Group V. Examples of the Heusler alloy include $Co_2FeSi$, $Co_2MnSi$, and $Co_2Mn_{1-a}Fe_aAl_bSi_{1-b}$ ($0 \le a \le 1$, $0 \le b \le 1$).

In order to fix the magnetization of the ferromagnetic layer (magnetization fixed layer) functioning as a magnetization fixed layer, an antiferromagnetic layer may be added so that it comes in contact with the magnetization fixed layer. In addition, the magnetic anisotropy caused by a crystal structure, a shape or the like may be used to fix the magnetization of the magnetization fixed layer. FeO, CoO, NiO, $CuFeS_2$, IrMn, FeMn, PtMn, Cr, Mn or the like can be used for the antiferromagnetic layer.

A nonmagnetic material is preferably used for the spacer layer 101C. The spacer layer 101C includes a layer composed of a conductor, an insulator or a semiconductor or a layer having an electric conduction point composed of a conductor in an insulator.

For example, when the spacer layer 101C is made of an insulator, the magnetoresistance effect element 101 is a tunnel magnetoresistance (TMR) effect element, and when the spacer layer 101C is made of a metal, the magnetoresistance effect element 101 is a giant magnetoresistance (GMR) effect element.

When an insulating material is applied for the spacer layer 101C, an insulating material such as $Al_2O_3$ or MgO can be used. A high magnetoresistance change ratio is obtained by adjusting the film thickness of the spacer layer 101C so that a coherent tunnel effect is exhibited between the first ferromagnetic layer 101A and the second ferromagnetic layer 101B. In order to efficiently use a TMR effect, the thickness of the spacer layer 101C is preferably about 0.5 to 3.0 nm.

When the spacer layer 101C is made of a conductive material, the conductive material such as Cu, Ag, Au or Ru can be used. In order to efficiently use a GMR effect, the thickness of the spacer layer 101C is preferably about 0.5 to 3.0 nm.

When the spacer layer 101C is made of a semiconductor, a material such as ZnO, $In_2O_3$, $SnO_2$, ITO, $GaO_x$, or $Ga_2O_x$, can be used. In this case, the thickness of the spacer layer 101C is preferably about 1.0 to 4.0 nm.

When a layer having an electric conduction point composed of a conductor in an insulator is applied as the spacer layer 101C, the insulator composed of $Al_2O_3$ or MgO preferably has a structure having an electric conduction point composed of a conductor such as CoFe, CoFeB, CoFeSi, CoMnGe, CoMnSi, CoMnAl, Fe, Co, Au, Cu, Al or Mg. In this case, the thickness of the spacer layer 101C is preferably about 0.5 to 2.0 nm.

The magnetoresistance effect element 101 can be a magnetoresistance effect element in which both the first ferromagnetic layer 101A and the second ferromagnetic layer 101B are set as magnetization free layers, and which includes the two magnetization free layers and a spacer layer disposed between the two magnetization free layers. In this case, magnetization directions of the first ferromagnetic layer 101A and the second ferromagnetic layer 101B can be changed relative to each other. As an example, a magnetoresistance effect element in which two magnetization free layers are magnetically coupled with a spacer layer therebetween is an exemplary example. More specifically, an example in which two magnetization free layers are magnetically coupled with a spacer layer therebetween so that magnetization directions of the two magnetization free layers when no external magnetic field is applied are antiparallel to each other is an exemplary example.

<High-Frequency Signal Line>

When a high-frequency current flows, the high-frequency signal line 103 generates a high-frequency magnetic field, and a high-frequency magnetic field generated from at least a part thereof is applied to the first ferromagnetic layer 101A.

The high-frequency signal line 103 includes an overlapping part 103A disposed at a position overlapping the magnetoresistance effect element 101 and a non-overlapping part 103B (103Baa, 103Bab, 103Bba, and 103Bbb) disposed at a position not overlapping the magnetoresistance effect element 101 in a plan view from the stacking direction L. At least a part of the non-overlapping part 103B (a reference numeral 103Baa part, a reference numeral 103Bba part, a part of a reference numeral 103Bab part, and a part of a reference numeral 103Bbb part) is formed to be thicker than at least a part of the overlapping part 103A. The overlapping part 103A is disposed apart from the magnetoresistance effect element 101 in the stacking direction L with an insulator therebetween.

The distance in the stacking direction L between a virtual plane V-V' including a surface 101Aa on the side of the overlapping part 103A of the first ferromagnetic layer 101A and a center line X in the high-frequency signal line 103 in the stacking direction L is shorter in at least a part of the overlapping part 103A than in at least a part of the non-overlapping part 103B.

When the distance in the stacking direction L between the virtual plane V-V' and the center line X in the overlapping part 103A is defined as $D_A$, and distances in the stacking direction L between the virtual plane V-V' and the center line X in the reference numeral 103Baa part, the reference numeral 103Bab part, the reference numeral 103Bbb part, and the reference numeral 103Bba part constituting the non-overlapping part 103B are defined as $D_{aa}$, $D_{ab}$, $D_{bb}$, and $D_{ba}$, respectively, $D_A$ is shorter than $D_{aa}$ and $D_{ba}$ and is equal to or shorter than $D_{ab}$ and $D_{bb}$. In other words, $D_A$ which is a distance with respect to the overlapping part 103A is shorter than $D_{aa}$ and $D_{ba}$ which are distances with respect to the reference numeral 103Baa part and the reference numeral 103Bba part which are parts of the non-overlapping part 103B.

In this manner, when a distance between the virtual plane V-V' and the center line X in the overlapping part 103A of the high-frequency signal line 103 positioned above the magnetoresistance effect element 101 is reduced, a high-frequency magnetic field generated in the high-frequency signal line 103 can be applied at a larger strength to the magnetoresistance effect element 101, the non-overlapping part 103B around the overlapping part 103A is formed to be thicker, and the resistance of the high-frequency signal line 103 can be reduced, and thereby high-frequency characteristics are improved.

The shape of the high-frequency signal line 103 is not particularly limited as long as it has a configuration in which at least a part of the non-overlapping part is formed to be thicker than at least a part of the overlapping part, and a distance in the stacking direction between the virtual plane V-V' and the center line of the high-frequency signal line 103 in the stacking direction is shorter in at least a part of the overlapping part than at least a part of the non-overlapping part.

In another view of a configuration of the magnetoresistance effect device 100 shown in FIG. 2, assuming that the overlapping part 103A is on the side above the magnetoresistance effect element 101 in the stacking direction L, the high-frequency signal line 103 can have, at at least the part of the non-overlapping part 103B, a protrusion that protrudes to a level above at least a part of the overlapping part 103A in the stacking direction L. In such a configuration, the protrusion is constituted by the reference numeral 103Baa part, the reference numeral 103Bba part, a part of the reference numeral 103Bab part, and a part of the reference numeral 103Bbb part.

In the arrangement shown in FIG. 2, when the overlapping part 103A is "above" a magnetoresistance effect element in the stacking direction L, a direction of Lu is "upward in the stacking direction," and a direction of Ld is "downward in the stacking direction."

<Electrode Wiring>

A first electrode wiring 107 and a second electrode wiring 108 are connected to both ends of the magnetoresistance effect element 101 in the stacking direction L, that is, the side of the first ferromagnetic layer 101A and the side of the second ferromagnetic layer 101B when viewed from the spacer layer 101C. Here, "be connected includes both direct connection to the first ferromagnetic layer or the second ferromagnetic layer 101B and indirect connection with another layer therebetween.

A current or a voltage is applied to the magnetoresistance effect element 101 through at least one of the first electrode wiring 107 and the second electrode wiring 108. In addition, at least one of the first electrode wiring 107 and the second electrode wiring 108 transmits a signal output from the magnetoresistance effect element 101. For example, a direct current or a DC voltage may be applied to the magnetoresistance effect element 101 through the first electrode wiring 107 and the second electrode wiring 108. In addition, for example, the second electrode wiring 108 may transmit a signal (a high-frequency voltage or a high-frequency current) output from the magnetoresistance effect element 101.

As a material of the first electrode wiring 107 and the second electrode wiring 108, for example, a material having conductivity such as Ta, Cu, Au, AuCu, Ru, and Al can be used.

Second Embodiment

Figure 3:
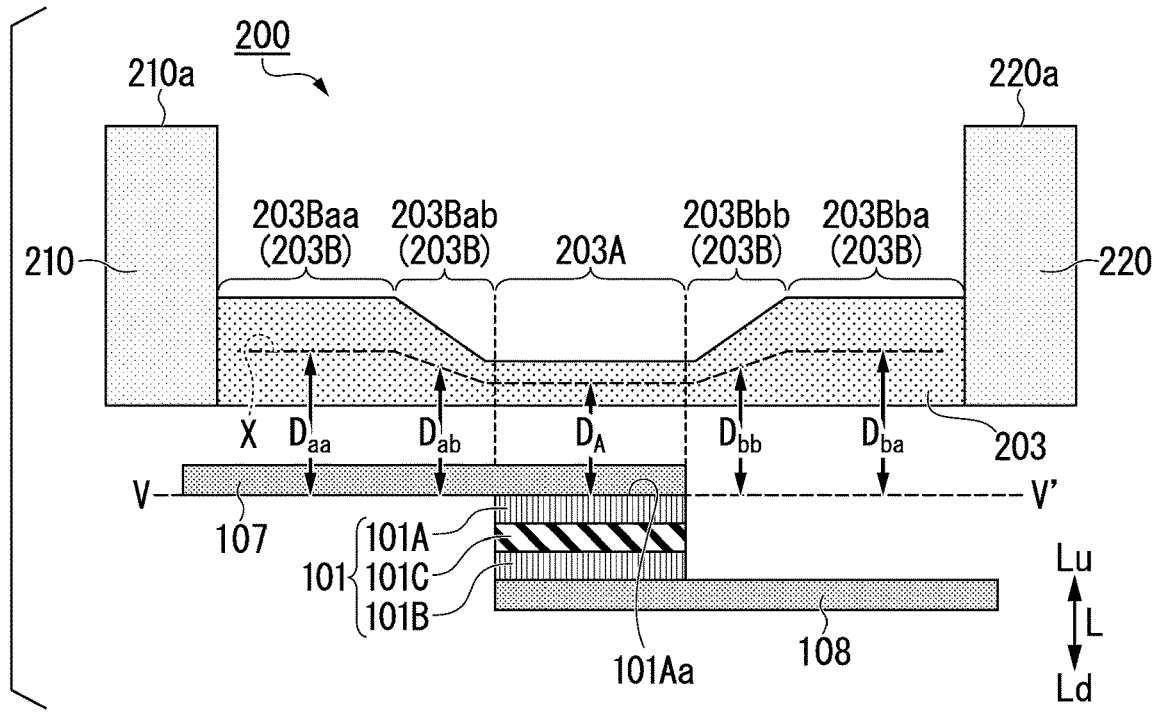
FIG. 3 is a cross-sectional view schematically showing an exemplary configuration of a magnetoresistance effect device 200 according to a second embodiment of the present disclosure.

FIG. 3 is a cross-sectional view schematically showing an exemplary configuration of a magnetoresistance effect device 200 according to a second embodiment of the present disclosure. Parts the same as in the first embodiment will be denoted with the same reference numerals regardless of differences in shapes.

In addition to the configuration shown in the magnetoresistance effect device 100 according to the first embodiment, the magnetoresistance effect device 200 includes pad parts (a first pad part 210 and a second pad part 220) which are electrically connected to a high-frequency signal line 203 and of which at least parts of end surfaces 210a and 220a are exposed so that they can be electrically connected to the outside. In the example shown in FIG. 3, the first pad part 210 and the second pad part 220 extend in the stacking direction L.

That is, like the magnetoresistance effect device 100, in a plan view from the stacking direction L, the configuration shown in FIG. 3 includes an overlapping part 203A disposed at a position overlapping the magnetoresistance effect element 101 and a non-overlapping part 203B (203Baa, 203Bab, 203Bba, and 203Bbb) disposed at a position not overlapping the magnetoresistance effect element 101, at least a part of the non-overlapping part 203B (a reference numeral 203Baa part, a reference numeral 203Bba part, a part of a reference numeral 203Bab part, and a part of a reference numeral 203Bbb part) is formed to be thicker than at least a part of the overlapping part 203A, and the distance in the stacking direction L between the virtual plane V-V' and the center line X in the high-frequency signal line 203 in the stacking direction L is shorter in at least a part of the overlapping part 203A than in at least a part of the non-overlapping part 203B. On the other hand, unlike the magnetoresistance effect device 100, the first pad part 210 connected to the 203Baa part of the non-overlapping part of the high-frequency signal line 203 and the second pad part 220 connected to the 203Bba part of the non-overlapping part of the high-frequency signal line 203 are provided.

The first pad part 210 and the second pad part 220 are used as bonding pads for bonding an external connection wire or bump, and when a probe (an inspection needle) is applied to the first pad part and the second pad part in an inspection during a production process, the inspection can be performed.

The shape of pad parts (the first pad part 210 and the second pad part 220) is not particularly limited as long as the above object is achieved.

Based on functions of the pad parts, the size of the pad parts in a plan view is not limited. For example, when the shape is circular in a plan view, its diameter is, for example, about 50 μm to 150 μm, and its thickness (the thickness in the stacking direction L) is not limited, and, for example, may be about 2 μm to 50 μm.

As a material of the pad parts, for example, a material having conductivity such as Ta, Cu, Au, AuCu, Ru, and Al can be used.

Third Embodiment

Figure 4:
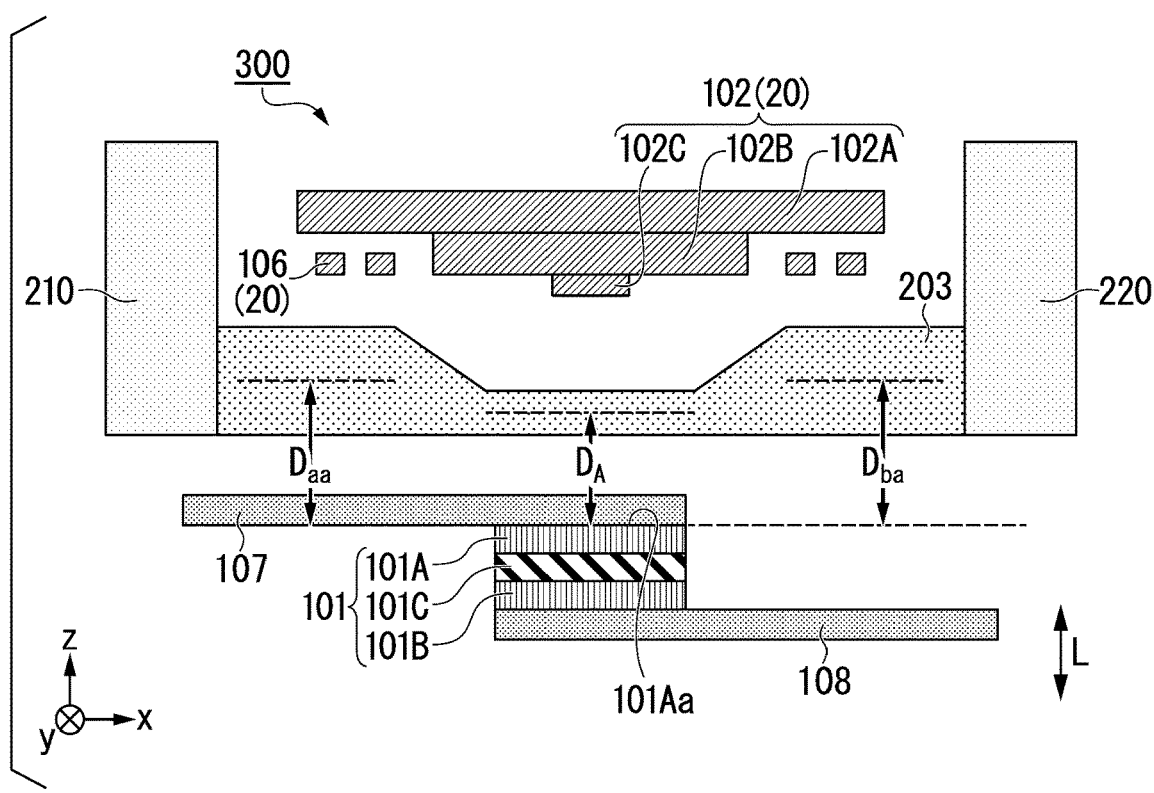
FIG. 4 is a cross-sectional view schematically showing an exemplary configuration of a magnetoresistance effect device 300 according to a third embodiment of the present disclosure.

FIG. 4 is a cross-sectional view schematically showing an exemplary configuration of a magnetoresistance effect device 300 according to a third embodiment of the present disclosure. Parts the same as in the second embodiment will be denoted with the same reference numerals regardless of the difference in shapes.

In addition to the configuration shown in the magnetoresistance effect device 200 according to the second embodiment, the magnetoresistance effect device 300 further includes a magnetic field applying unit 102 configured to apply a magnetic field to the magnetoresistance effect element 101. The magnetic field applying unit 102 is disposed on the side opposite to the magnetoresistance effect element 101 with the high-frequency signal line 203 therebetween and the pad parts (the first pad part 210 and second pad part 220) are disposed in areas that do not overlap the magnetic member 102 in a plan view from the stacking direction L.

A static magnetic field can be applied to the first ferromagnetic layer 101A by the magnetic field applying unit 102.

<Magnetic Field Applying Unit>

A magnetic field applying unit 20 shown in FIG. 4 includes the first magnetic member 102 and a coil 106. A configuration including only any one of the first magnetic member 102 and the coil 106 may be used or a configuration including a second magnetic member disposed on the side of the second ferromagnetic layer 101B of the magnetoresistance effect element 101 as a magnetic field applying unit and a connecting part connecting the first magnetic member 102 and the second magnetic member may be used.

The first magnetic member 102 is disposed on the side of the first ferromagnetic layer 101A of the magnetoresistance effect element 101. The coil 106 is wound around a protrusion 102B. The coil 106 induces a magnetic flux, the induced magnetic flux concentrates on a protrusion 102C to form a magnetic field directed to the magnetoresistance effect element 101. In FIG. 4, the coil 106 is a spiral coil wound in a spiral shape around the protrusion 102B. In FIG. 4, the coil 106 is a single layer in the z direction, but two or more layers may be stacked.

The first magnetic member 102, the second magnetic member and the connecting part are made of a magnetic material. The first magnetic member 102, the second magnetic member and the connecting part can be made of, for example, Fe, Co, Ni, an alloy of Ni and Fe, an alloy of Fe and Co, or an alloy of Fe, Co, and B. The coil 106 has a wiring pattern having high conductivity and can be made of, for example copper, aluminum, or the like.

The first magnetic member 102 shown in FIG. 4 includes the protrusions 102B and 102C and a base 102A. The base 102A is a main part of the first magnetic member 102, and is a part that extends in an xy in-plane direction in FIG. 4.

The connecting part (not shown) is part connecting the first magnetic member 102 and the second magnetic member (not shown) and is a part for stabilizing a flow of a magnetic field. The protrusion 102C is a part in which a magnetic flux line flows from its surface or a magnetic flux line flows into the surface. In addition, a magnetic flux line flowing from the protrusion 102C or a magnetic flux line flowing thereinto is responsible for a magnetic flux line applied to the magnetization free layer by the first magnetic member 102. Here, "responsible" means that it is responsible in consideration of the strength of the magnetic field (magnetic flux density).

The shape of the first magnetic member is not particularly limited as long as the above functions are achieved.

The number of protrusions is not limited to one, but a plurality of protrusions may be used.

The first magnetic member may include the base 102A having a constant horizontal cross-sectional area (a cross section orthogonal to the stacking direction L) and an element side part which is disposed on the side of the magnetoresistance effect element 101 of the base 102A and has a smaller horizontal cross-sectional area than the horizontal cross-sectional area of the base 102A.

Such an element side part may have a multi-stage structure in which a plurality of protrusions are stacked in the protrusion direction (for example, a multi-stage structure in which cylinder groups with different diameters are stacked from the side of the base 102A in descending order of the diameter) (in the case of two stages of protrusions, refer to FIG. 4).

The base 102A and the protrusions may be integrated or separated.

The protrusions may have cross-sectional areas of surfaces orthogonal to the protrusion direction that continuously change or may include parts in which such cross-sectional areas continuously change and protrusions having constant cross-sectional areas of surfaces orthogonal to the protrusion direction.

As a material of the first magnetic member 102, any of a soft magnetic material and a hard magnetic material may be used. FIG. 4 shows an exemplary case in which a soft magnetic material (yoke) is used for the first magnetic member 102 and the coil 106 for applying a magnetic field to a magnetoresistance effect element is wound around the protrusion 102B. In this example, an exemplary example of a spiral coil in which a metal pattern is wound in a spiral shape is the coil 106, but the type of the coil 106 is not limited. Here, a deep part of the coil 106 is not shown. In addition, when the value of a current flowing through the coil 106 is adjusted, it is possible to change the magnitude of the static magnetic field applied to the magnetoresistance effect element 101.

Here, while FIG. 4 shows an example in which the coil 106 is wound around the protrusion 102B, the coil 106 may be wound around another part of the first magnetic member 102.

When the first magnetic member 102 is made of a soft magnetic material, a soft magnetic material (as an example, a NiFe alloy or a CoFe alloy) such as a metal or an alloy containing at least one of Fe, Ni and Co can be used as the material.

When the first magnetic member 102 is made of a hard magnetic material, the coil 106 may be wound around the first magnetic member 102 as shown in FIG. 4 or may not be wound. When the first magnetic member 102 is made of a hard magnetic material, a CoPt alloy, an FePt alloy, a CoCrPt alloy or the like can be used as the material. In addition, a material in which an antiferromagnetic material such as IrMn is magnetically connected to the above soft magnetic material and the magnetization direction of the soft magnetic material is fixed can be used for the first magnetic member 102. In that case, a coil may be wound around the first magnetic member 102 as shown in FIG. 4 or may not be wound.

Fourth Embodiment

Figure 5:
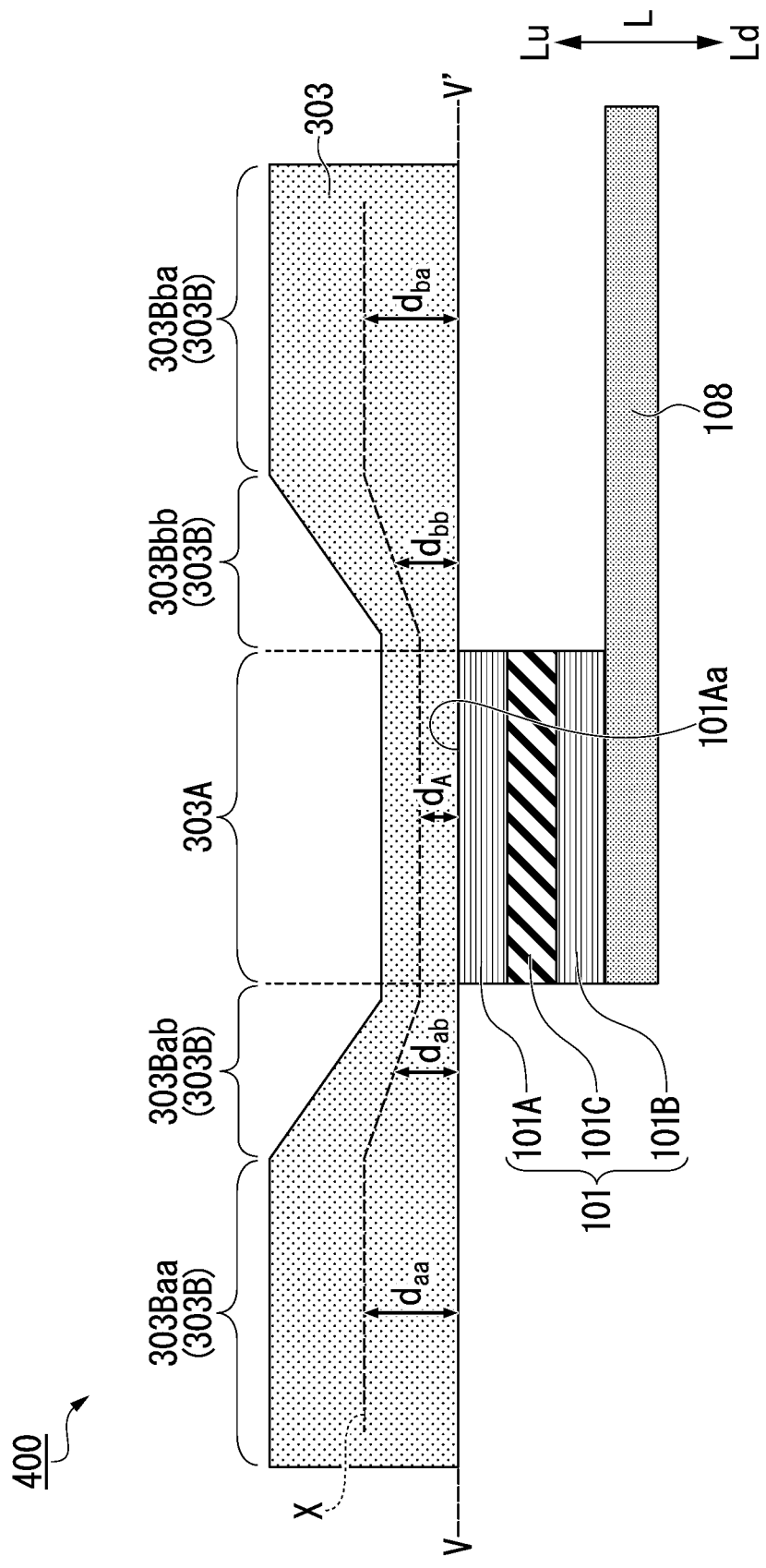
FIG. 5 is a cross-sectional view schematically showing an exemplary configuration of a magnetoresistance effect device 400 according to a fourth embodiment of the present disclosure.

FIG. 5 is a cross-sectional view schematically showing an exemplary configuration of a magnetoresistance effect device 400 according to a fourth embodiment of the present disclosure. Parts the same as in the first embodiment will be denoted with the same reference numerals regardless of the difference in shapes.

In the magnetoresistance effect device 400, a high-frequency signal line 303 is connected to the side of the first ferromagnetic layer 101A (in the example in FIG. 5, the surface 101Aa on the side opposite to the spacer layer of the first ferromagnetic layer 101A) when viewed from the spacer layer 101C of the magnetoresistance effect element 101. The magnetoresistance effect device 400 is driven when a high-frequency magnetic field from the high-frequency signal line 303 is applied to the first ferromagnetic layer 101A, which is the same as in the above embodiments. In addition, a part of a high-frequency current flowing through the high-frequency signal line 303 is applied to the magnetoresistance effect element 101.

In a plan view from the stacking direction L, the high-frequency signal line 303 includes an overlapping part 303A disposed at a position overlapping the magnetoresistance effect element 101 and a non-overlapping part 303B (303Baa, 303Bab, 303Bba, and 303Bbb) disposed at a position not overlapping the magnetoresistance effect element 101.

The high-frequency signal line 303 shown in FIG. 5 has a configuration similar to that of the high-frequency signal line 103 shown in FIG. 2. However, unlike the magnetoresistance effect device 100 shown in FIG. 2, the first electrode wiring 107 shown in FIG. 2 is not provided and the overlapping part 303A of the high-frequency signal line 303 is electrically connected to the magnetoresistance effect element 101.

At least a part of the non-overlapping part 303B (a reference numeral 303Baa part, a reference numeral 303Bba part, a part of a reference numeral 303Bab part, and a part of a reference numeral 303Bbb part) is formed to be thicker than at least a part of the overlapping part 303A.

A distance in the stacking direction L between the virtual plane V-V' and the center line X in the high-frequency signal line 303 in the stacking direction L is shorter in at least a part of the overlapping part 303A than in at least a part of the non-overlapping part 303B.

When a distance in the stacking direction L between the virtual plane V-V' and the center line X in the overlapping part 303A is defined as $d_A$ and distances in the stacking direction L between the virtual plane V-V' and the center line X in the reference numeral 303Baa part, the reference numeral 303Bab part, the reference numeral 303Bbb part, and the reference numeral 303Bba part constituting the non-overlapping part 303B are defined as $d_{aa}$, $d_{ab}$, $d_{bb}$, and $d_{ba}$, respectively, $d_A$ is shorter than $d_{aa}$, and $d_{ba}$, and is equal to or shorter than $d_{ab}$, and $d_{bb}$. In other words, $d_A$ which is a distance with respect to the overlapping part 303A is shorter than $d_{aa}$, and $d_{ba}$ which are distances with respect to the reference numeral 303Baa part and the reference numeral 303Bba part which are parts of the non-overlapping part 303B.

In this manner, when a distance between the virtual plane V-V' and the overlapping part 303A of the high-frequency signal line 303 positioned above the magnetoresistance effect element 101 is reduced, a larger high-frequency magnetic field than that of the high-frequency signal line 103 can be applied to the magnetoresistance effect element 101, the non-overlapping part 303B around the overlapping part 303A is formed to be thicker, and the resistance of the high-frequency signal line 303 can be reduced, and thereby high-frequency characteristics are improved.

Fifth Embodiment

Figure 6:
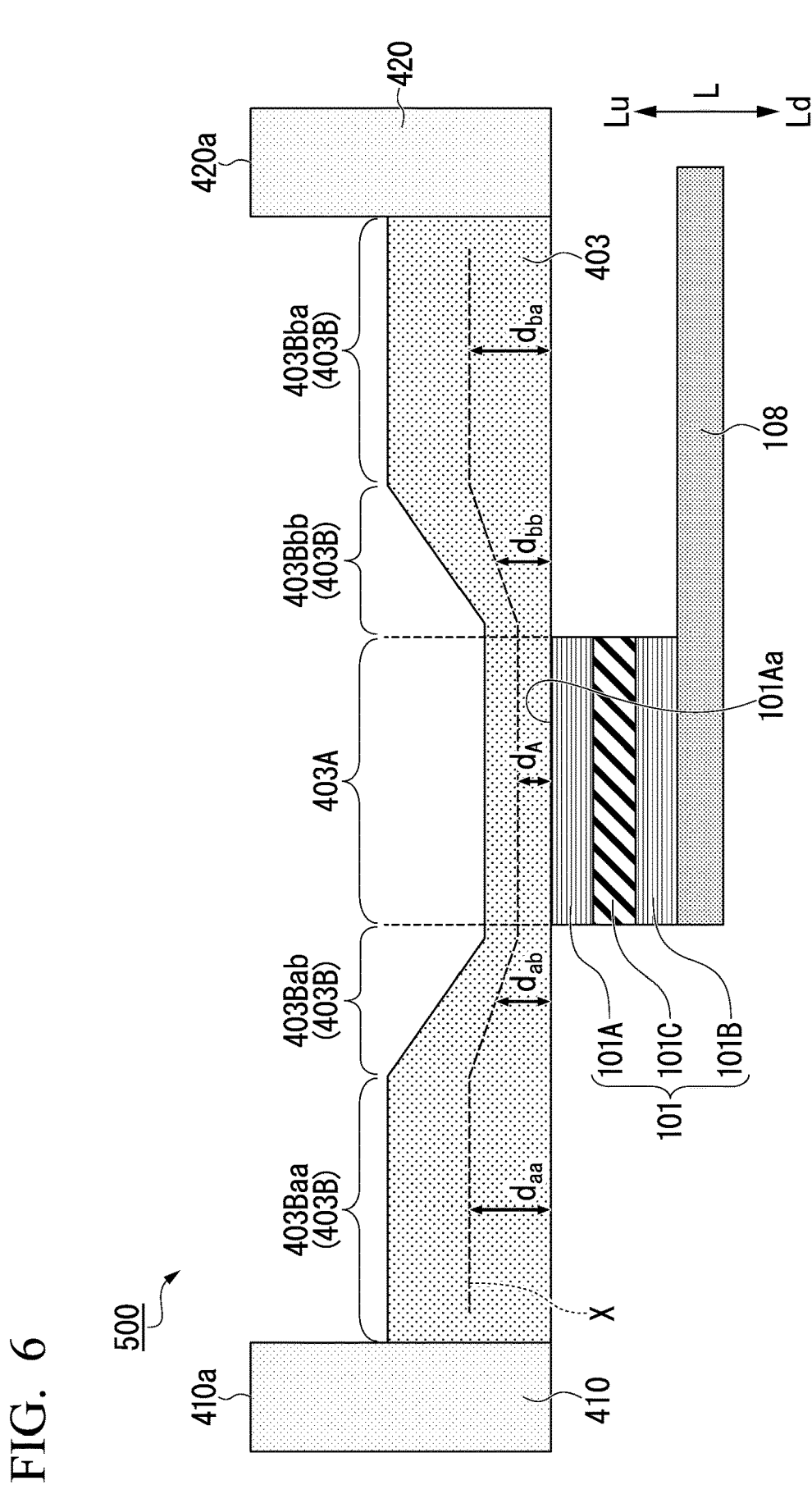
FIG. 6 is a cross-sectional view schematically showing an exemplary configuration of a magnetoresistance effect device 500 according to a fifth embodiment of the present disclosure.

FIG. 6 is a cross-sectional view schematically showing an exemplary configuration of a magnetoresistance effect device 500 according to a fifth embodiment of the present disclosure. Parts the same as in the fourth embodiment will be denoted with the same reference numerals regardless of the difference in shapes.

In addition to the configuration shown in the magnetoresistance effect device 400 according to the fourth embodiment, the magnetoresistance effect device 500 includes pad parts (a first pad part 410 and a second pad part 420) which are electrically connected to a high-frequency signal line 403 and of which at least parts of end surfaces 410a and 420a are exposed so that they can be electrically connected to the outside. In the example shown in FIG. 6, the first pad part 410 and the second pad part 420 extend in the stacking direction L.

That is, like the magnetoresistance effect device 400, in a plan view from the stacking direction L, the configuration shown in FIG. 6 includes an overlapping part 403A disposed at a position overlapping the magnetoresistance effect element 101 and a non-overlapping part 403B (403Baa, 403Bab, 403Bba, and 403Bbb) disposed at a position not overlapping the magnetoresistance effect element 101, at least a part of the non-overlapping part 403B (a reference numeral 403Baa part, a reference numeral 403Bba part, a part of a reference numeral 403Bab part, and a part of a reference numeral 403Bbb part) is formed to be thicker than at least a part of the overlapping part 403A, and a distance in the stacking direction L between the virtual plane V-V' and the center line X in the high-frequency signal line 403 in the stacking direction L is shorter in at least a part of the overlapping part 403A than in at least a part of the non-overlapping part 403B. On the other hand, unlike the magnetoresistance effect device 400, the first pad part 410 connected to the part of 403Baa of the non-overlapping part of the high-frequency signal line 403 and the second pad part 420 connected to the part of 403Bba of the non-overlapping part of the high-frequency signal line 403 are provided.

The first pad part 410 and the second pad part 420 are used as bonding pads for bonding an external connection wire or bump, and when a probe (an inspection needle) is applied to the first pad part and the second pad part in an inspection during a production process, the inspection can be performed.

The shape of pad parts (the first pad part 410 and the second pad part 420) is not particularly limited as long as the above object is achieved.

Based on functions of the pad parts, the size of the pad parts in a plan view is not limited. For example, when the shape is circular in a plan view, its diameter is, for example, about 50 µm to 150 µm, and its thickness (the thickness in the stacking direction L) is not limited, and, for example, may be about 2 µm to 50 µm.

As a material of the pad parts, for example, a material having conductivity such as Ta, Cu, Au, AuCu, Ru, and Al can be used.

Sixth Embodiment

Figure 7:
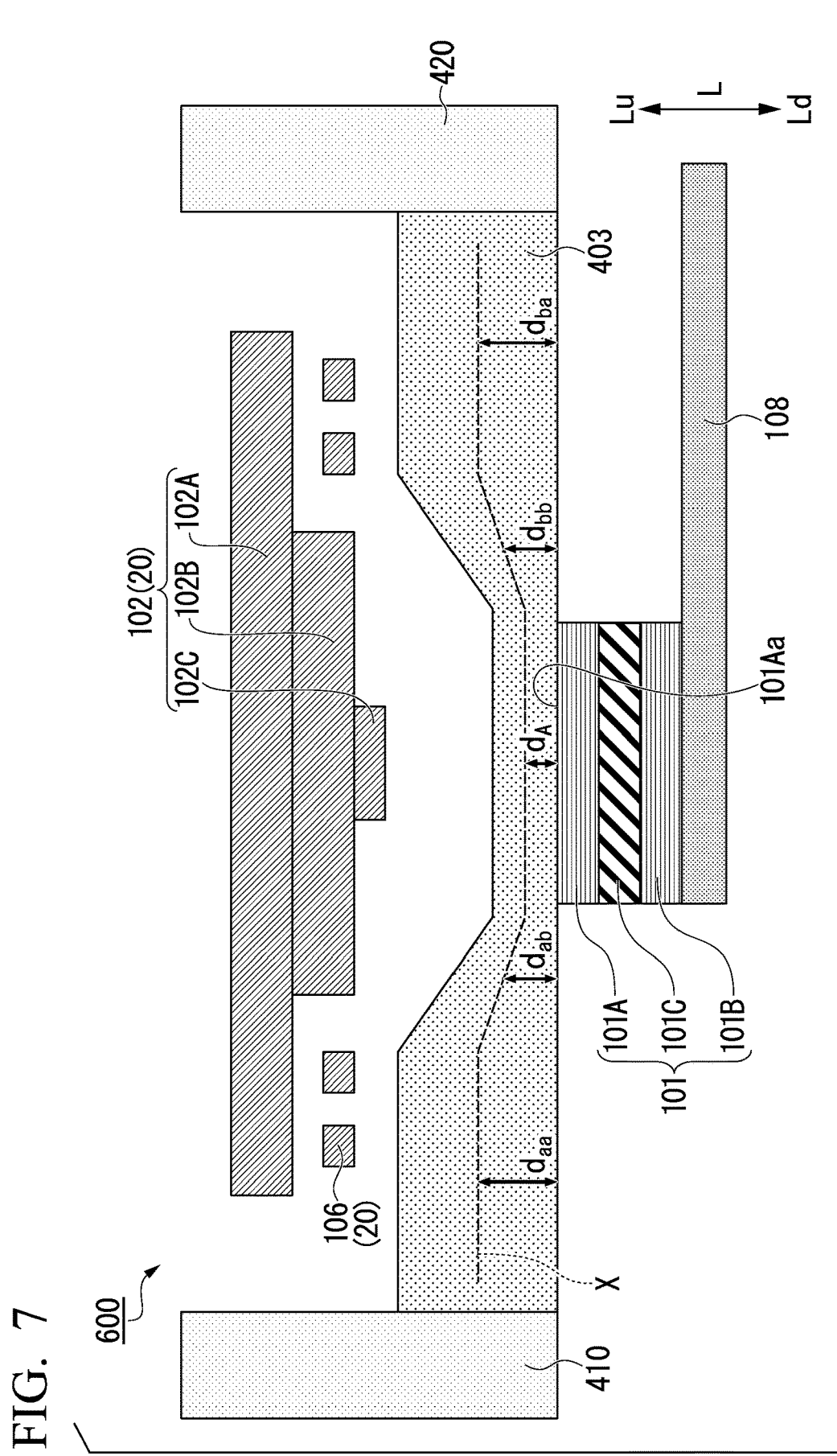
FIG. 7 is a cross-sectional view schematically showing an exemplary configuration of a magnetoresistance effect device 600 according to a sixth embodiment of the present disclosure.

FIG. 7 is a cross-sectional view schematically showing an exemplary configuration of a magnetoresistance effect device 600 according to a sixth embodiment of the present disclosure. Parts the same as in the third embodiment will be denoted with the same reference numerals regardless of the difference in shapes In the magnetoresistance effect device 600, the high-frequency signal line 403 is connected to the side of the first ferromagnetic layer 101A (in the example in FIG. 7, the surface 101Aa on the side opposite to the spacer layer of the first ferromagnetic layer 101A) when viewed from the spacer layer 101C of the magnetoresistance effect element 101. The magnetoresistance effect device 600 is driven when a high-frequency magnetic field from the high-frequency signal line 403 is applied to the first ferromagnetic layer 101A, which is the same as in the above embodiment. In addition, a part of a high-frequency current flowing through the high-frequency signal line 403 is applied to the magnetoresistance effect element 101.

In a plan view from the stacking direction L, the high-frequency signal line 403 includes the overlapping part 403A disposed at a position overlapping the magnetoresistance effect element 101 and the non-overlapping part 403B (403Baa, 403Bab, 403Bba, and 403Bbb) disposed at a position not overlapping the magnetoresistance effect element 101.

The high-frequency signal line 403 has a configuration similar to that of the high-frequency signal line 203 shown in FIG. 4. However, unlike the magnetoresistance effect device 300 shown in FIG. 4, the first electrode wiring 107 shown in FIG. 4 is not provided and the overlapping part 403A of the high-frequency signal line 403 is electrically connected to the magnetoresistance effect element 101.

At least a part of the non-overlapping part 403B (a reference numeral 403Baa part, a reference numeral 403Bba part, a part of a reference numeral 403Bab part, and a part of a reference numeral 403Bbb part) is formed to be thicker than at least a part of the overlapping part 403A.

A distance in the stacking direction L between the virtual plane V-V' and the center line X in the high-frequency signal line 403 in the stacking direction L is shorter than in at least a part of the overlapping part 403A than in at least a part of the non-overlapping part 403B.

When a distance in the stacking direction L between the virtual plane V-V' and the center line X in the overlapping part 403A is defined as $d_A$ and distances in the stacking direction L between the virtual plane V-V' and the center line X in the reference numeral 403Baa part, the reference numeral 403Bab part, the reference numeral 403Bbb part, and the reference numeral 403Bba part constituting the non-overlapping part 403B are defined as $d_{aa}$, $d_{ab}$, $d_{bb}$, and $d_{ba}$, respectively, $d_A$ is shorter than $d_{aa}$, and $d_{ba}$ and is equal to or shorter than $d_{ab}$, and $d_{bb}$. In other words, $d_A$ which is a distance with respect to the overlapping part 403A is shorter than $d_{aa}$, and $d_{ba}$ which are distances with respect to the reference numeral 403Baa part and the reference numeral 403Bba part which are parts of the non-overlapping part 403B.

In this manner, when a distance between the virtual plane V-V' and the overlapping part 403A of the high-frequency signal line 403 positioned above the magnetoresistance effect element 101 is reduced, a larger high-frequency magnetic field than that of the high-frequency signal line 103 can be applied to the magnetoresistance effect element 101, the non-overlapping part 403B around the overlapping part 403A is formed to be thicker, and the resistance of the high-frequency signal line 403 can be reduced, and thereby high-frequency characteristics are improved.

Application Example 1

Figure 8:
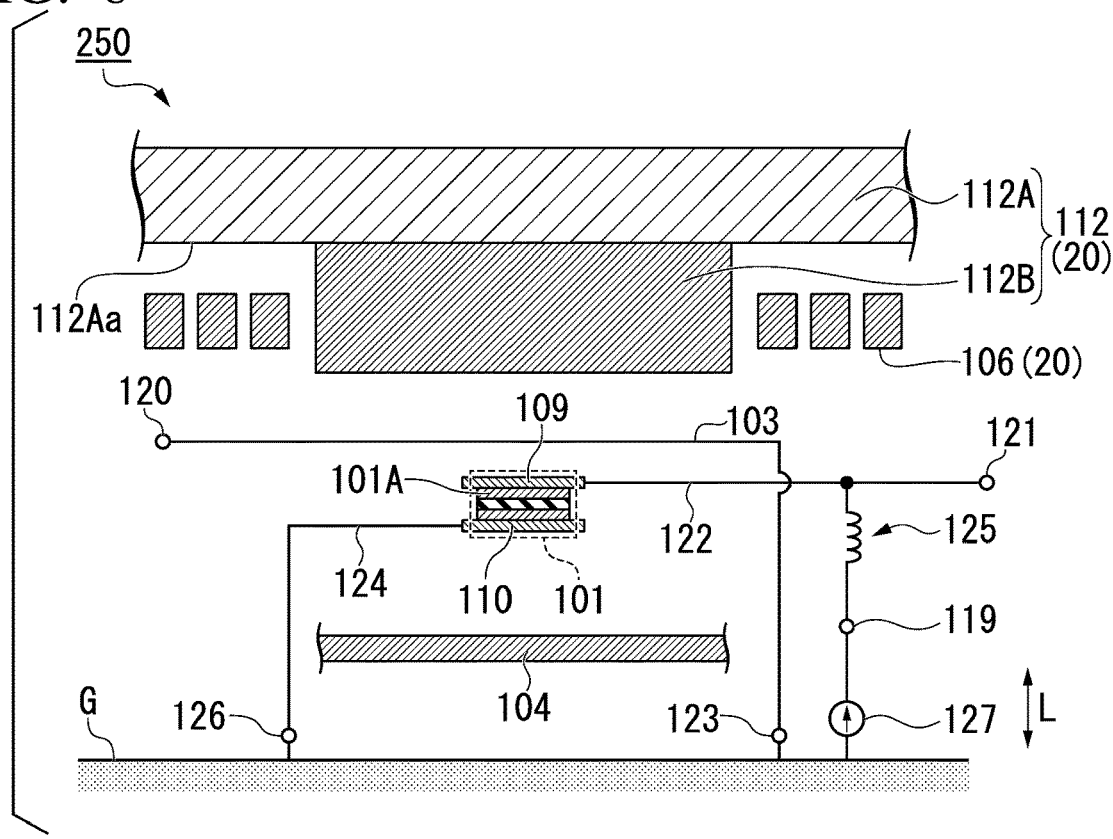
FIG. 8 is a diagram showing an exemplary configuration of a circuit of a high-frequency device to which a magnetoresistance effect device of the present disclosure is applied.

FIG. 8 shows an example of a circuit of a high-frequency device 250 to which the magnetoresistance effect device 100 is applied. The magnetoresistance effect device 100 may be replaced with the magnetoresistance effect device 200 according to another embodiment. Here, the high-frequency device 250 in which the above-described magnetoresistance effect element and high-frequency signal line and a magnetic field applying unit and another circuit element to be described below, and the like are incorporated may be collectively referred to as a magnetoresistance effect device. The high-frequency device 250 includes the magnetoresistance effect element 101, a first magnetic member 112, a second magnetic member 104, the high-frequency signal line 103, and a DC application terminal 119. The high-frequency device 250 receives a signal from a first port 120 and outputs a signal from a second port 121.

<Magnetoresistance Effect Element and Magnetic Field Applying Unit>

For the magnetoresistance effect element 101, as an example, an element that satisfies a configuration of the magnetoresistance effect device 100 according to the above first embodiment is used. In the example shown in FIG. 8, an upper electrode 109 and a lower electrode 110 are formed at both ends of the magnetoresistance effect element 101. In Application Example 1, an example in which the second ferromagnetic layer 101B functions as a magnetization fixed layer and the first ferromagnetic layer 101A functions as a magnetization free layer has been described. This also applies to Application Example 2 to be described below.

Figure 1B:
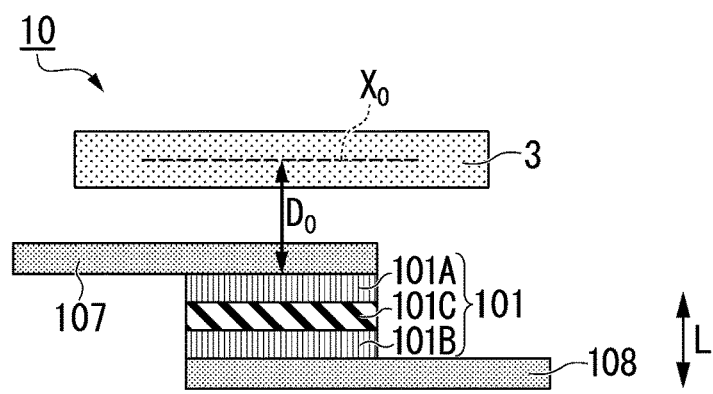
FIG. 1B is a cross-sectional view schematically showing a configuration in the vicinity of a magnetoresistance effect element.

The first magnetic member 112 shown in FIG. 8 includes a base 112A and a protrusion 112B that protrudes toward the magnetoresistance effect element 101 (the side of one surface 112Aa of a base) in a direction parallel to the stacking direction L. The protrusion 112B protrudes from one surface 112Aa of the base toward the magnetoresistance effect element 101 in a direction parallel to the stacking direction L. The first magnetic member 112 is disposed on one side (the upper side in FIG. 1A and FIG. 1B) of the magnetoresistance effect element 101 in a direction parallel to the stacking direction L.

The base 112A and the protrusion 112B may be integrated or separated.

The coil 106 is wound around the protrusion 112B. The second magnetic member 104 is disposed on the side opposite to the first magnetic member 112 when viewed from the magnetoresistance effect element 101. The first magnetic member 112 and the second magnetic member 104 are connected in an outer area in the drawing by a magnetic member (not shown). The first magnetic member 112, the second magnetic member 104, and the coil 106 constitute a magnetic field applying unit configured to apply an external magnetic field (static magnetic field) to the magnetoresistance effect element 101.

A frequency of an output signal can be set using the magnetic field applying unit (the first magnetic member 112, the second magnetic member 104, and the coil 106). The frequency of the output signal oscillates according to a ferromagnetic resonance frequency of the first ferromagnetic layer 101A that functions as a magnetization free layer. The ferromagnetic resonance frequency of the first ferromagnetic layer 101A oscillates according to an effective magnetic field in the first ferromagnetic layer 101A. The effective magnetic field in the first ferromagnetic layer 101A can vary according to an external magnetic field (a static magnetic field). Therefore, when a magnitude of the external magnetic field applied from the magnetic field applying unit to the first ferromagnetic layer 101A is changed, a ferromagnetic resonance frequency of the first ferromagnetic layer 101A can be changed.

<First Port and Second Port>

A first port 120 is an input terminal of the high-frequency device 250. The first port 120 corresponds to one end of the high-frequency signal line 103. When an AC signal source (not shown) is connected to the first port 120, an AC signal (high-frequency signal) can be applied to the high-frequency device 250. A high-frequency signal applied to the high-frequency device 250 is, for example, a signal having a frequency of 100 MHz or more.

The second port 121 is an output terminal of the high-frequency device 250. The second port 121 corresponds to one end of an output signal line 122 through which a signal output from the magnetoresistance effect element 101 is transmitted. The output signal line 122 and the upper electrode 109 correspond to the first electrode wiring 107 shown in FIG. 2.

<High-Frequency Signal Line>

One end of the high-frequency signal line 103 in FIG. 8 is connected to the first port 120. In addition, in the high-frequency device 250, the other end of the high-frequency signal line 103 is connected to a reference potential through a reference potential terminal 123 for use. In FIG. 8, a connection to a ground G as a reference potential is performed. The ground G that is attached to the outside of the high-frequency device 250 can be used. According to a potential difference between a high-frequency signal input to the first port 120 and the ground G, a high-frequency current flows in the high-frequency signal line 103. When a high-frequency current flows in the high-frequency signal line 103, a high-frequency magnetic field is generated from the high-frequency signal line 103. This high-frequency magnetic field is applied to the first ferromagnetic layer 101A of the magnetoresistance effect element 101.

<Output Signal Line and Other Lines>

The output signal line 122 transmits a signal output from the magnetoresistance effect element 101. The signal output from the magnetoresistance effect element 101 is a signal with a frequency selected using ferromagnetic resonance of the first ferromagnetic layer 101A functioning as a magnetization free layer. In the output signal line 122 in FIG. 8, one end is connected to the magnetoresistance effect element 101 via the upper electrode 109 and the other end is connected to the second port 121. That is, the output signal line 122 in FIG. 8 connects the magnetoresistance effect element 101 and the second port 121.

In addition, a capacitor may be provided in the output signal line 122 (as an example, the output signal line 122 between a part of an inductor 125 connected to the output signal line 122 and the second port 121) between a part constituting a closed circuit with a power supply 127, the output signal line 122, the magnetoresistance effect element 101, a line 124, and the ground G and the second port 121. When a capacitor is provided in the part, it is possible to avoid applying an invariant component of a current to an output signal output from the second port 121.

In the line 124, one end is connected to the magnetoresistance effect element 101 via the lower electrode 110. The line 124 and the lower electrode 110 correspond to the second electrode wiring 108 shown in FIG. 2. In addition, in the high-frequency device 250, the other end of the line 124 is connected to a reference potential via a reference potential terminal 126 for use. While the line 124 is connected to the common ground G as the reference potential of the high-frequency signal line 103 in FIG. 8, it may be connected to another reference potential. In order to simplify the circuit configuration, a reference potential of the high-frequency signal line 103 and a reference potential of the line 124 are preferably common.

As the shape of lines and the ground G, a micro strip line (MSL) type or a coplanar waveguide (CPW) type is preferably applied. When the micro strip line (MSL) type or the coplanar waveguide (CPW) type is applied, a line width and an inter-ground distance are preferably designed so that a characteristic impedance of a line and an impedance of a circuit system become the same. When designing is performed in this manner, it is possible to reduce transmission loss of the lines.

<DC Application Terminal>

The DC application terminal 119 is connected to the power supply 127, and a direct current or a DC voltage is applied to the magnetoresistance effect element 101 in the stacking direction L. In this specification, the direct current is a current whose direction does not vary with the time and includes a current whose magnitude oscillates with the time. In addition, the DC voltage is a voltage whose polarity does not vary with the time and includes a voltage whose magnitude oscillates with the time. The power supply 127 may be a direct current source or a DC voltage source.

The power supply 127 may be a direct current source that can generate a constant direct current or a DC voltage source that can generate a constant DC voltage. In addition, the power supply 127 may be a direct current source that can change a magnitude of a value of a generated direct current or may be a DC voltage source that can change a magnitude of a generated DC voltage value.

A current density of a current applied to the magnetoresistance effect element 101 is preferably lower than an oscillation threshold current density of the magnetoresistance effect element 101. The oscillation threshold current density of the magnetoresistance effect element refers to a current density at which the magnetization of a ferromagnetic layer functioning as a magnetization free layer of the magnetoresistance effect element starts precession at a constant frequency and a constant amplitude and serves as a threshold value at which the magnetoresistance effect element oscillates (an output (resistance value) of the magnetoresistance effect element fluctuates at a constant frequency and a constant amplitude).

The inductor 125 is disposed between the DC application terminal 119 and the output signal line 122. The inductor 125 cuts off a high-frequency component of a current and passes an invariant component of a current. An output signal (high-frequency signal) output from the magnetoresistance effect element 101 efficiently flows through the second port 121 by the inductor 125. In addition, an invariant component of a current flows through a closed circuit constituted by the power supply 127, the output signal line 122, the magnetoresistance effect element 101, the line 124, and the ground G by the inductor 125.

For the inductor 125, a resistance element including a chip inductor, an inductor with a pattern line, and an inductor component and the like can be used. The inductance of the inductor 125 is preferably 10 nH or more.

<Functions of High-Frequency Device>

When a high-frequency signal is input to the high-frequency device 250 from the first port 120, a high-frequency current corresponding to the high-frequency signal flows in the high-frequency signal line 103. A high-frequency magnetic field generated by a high-frequency current that flows in the high-frequency signal line 103 is applied to the first ferromagnetic layer 101A of the magnetoresistance effect element 101.

The magnetization of the first ferromagnetic layer 101A functioning as a magnetization free layer oscillates greatly when a frequency of a high-frequency magnetic field applied to the first ferromagnetic layer 101A by the high-frequency signal line 103 is close to a ferromagnetic resonance frequency of the first ferromagnetic layer 101A. This phenomenon is a ferromagnetic resonance phenomenon.

When vibration of the magnetization of the first ferromagnetic layer 101A increases, a change in the resistance value in the magnetoresistance effect element 101 increases. For example, when a constant direct current is applied from the DC application terminal 119 to the magnetoresistance effect element 101, the change in the resistance value of the magnetoresistance effect element 101 as a change in the potential difference between the upper electrode 109 and the lower electrode 110 is output from the second port 121. In addition, for example, when a constant DC voltage is applied from the DC application terminal 119 to the magnetoresistance effect element 101, the change in the resistance value of the magnetoresistance effect element 101 as a change in the value of a current that flows between the lower electrode 110 and the upper electrode 109 is output from the second port 121.

That is, when the frequency of a high-frequency signal input from the first port 120 is a frequency close to a ferromagnetic resonance frequency of the first ferromagnetic layer 101A, the amount of change in the resistance value of the magnetoresistance effect element 101 is larger and a large signal is output from the second port 121. On the other hand, when the frequency of a high-frequency signal deviates from a ferromagnetic resonance frequency of the first ferromagnetic layer 101A, the amount of change in the resistance value of the magnetoresistance effect element 101 is smaller and a signal is hardly output from the second port 121. That is, the high-frequency device 250 functions as a high-frequency filter that can selectively pass a high-frequency signal with a specific frequency.

<Other Applications>

In addition, while a case in which the high-frequency device 250 is used as a high-frequency filter is shown in the above application examples, the high-frequency device 250 can be applied as a high-frequency device such as an isolator, a phase shifter, and an amplifier.

When the high-frequency device 250 is used as an isolator, a signal is input from the second port 121. Even if a signal is input from the second port 121, since it is not output from the first port 120, the device functions as an isolator.

In addition, if the high-frequency device 250 is used as a phase shifter, when an output frequency band oscillates, a frequency with one arbitrary point in an output frequency band is focused on. When an output frequency band oscillates, since a phase at a specific frequency oscillates, the device functions as a phase shifter.

In addition, when the high-frequency device 250 is used as an amplifier, a direct current or a DC voltage applied from the power supply 127 is set to be a predetermined magnitude or more. Accordingly, a signal output from the second port 121 is larger than a signal input from the first port 120 and the device functions as an amplifier.

As described above, the high-frequency device 250 can function as a high-frequency device such as a high-frequency filter, an isolator, a phase shifter, and an amplifier.

While a case in which there is one magnetoresistance effect element 101 is an exemplary example as shown in FIG. 8, a plurality of magnetoresistance effect elements 101 may be used. In this case, the plurality of magnetoresistance effect elements 101 may be connected in parallel or may be connected in series. For example, when a plurality of magnetoresistance effect elements 101 having different ferromagnetic resonance frequencies are used, it is possible to widen a selection frequency band (pass frequency band). In addition, a configuration in which a high-frequency magnetic field generated in the output signal line 122 that outputs an output signal from one magnetoresistance effect element 101 is applied to another magnetoresistance effect element 101 may be used. In such a configuration, since the output signal is filtered a plurality of times, it is possible to increase the filtering accuracy of the high-frequency signal.

Application Example 2

Figure 9:
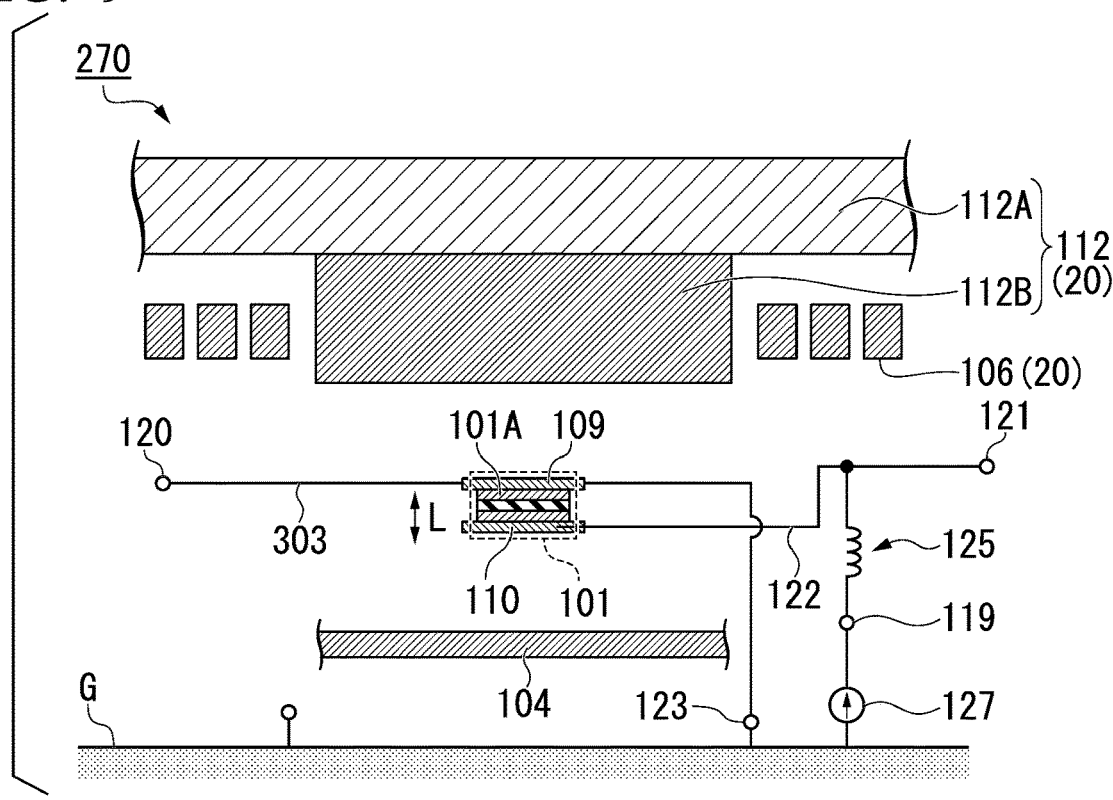
FIG. 9 is a diagram showing another exemplary configuration of a circuit of a high-frequency device to which a magnetoresistance effect device of the present disclosure is applied.

FIG. 9 shows an example of a circuit of a high-frequency device 270 to which the magnetoresistance effect device 400 is applied. The magnetoresistance effect device 400 may be replaced with the magnetoresistance effect device 500 according to another embodiment.

Here, in FIG. 9, a part of the high-frequency signal line 303 in the vicinity of the magnetoresistance effect element 101 is drawn as the upper electrode 109. In this case, the magnetization of the first ferromagnetic layer 101A can be vibrated using a high-frequency magnetic field that is generated from the high-frequency signal line 303 according to a high-frequency current that flows in the high-frequency signal line 303 and is applied to the magnetoresistance effect element 101 (the first ferromagnetic layer 101A). In addition, the magnetization of the first ferromagnetic layer 101A may be vibrated using a spin transfer torque that is generated by a high-frequency current that is applied from the high-frequency signal line 303 and flows through the magnetoresistance effect element 101 in the stacking direction L. In addition, the magnetization of the first ferromagnetic layer 101A may be vibrated using a spin orbit torque according to a spin current generated in a direction orthogonal to a flow direction of a high-frequency current that flows through a part corresponding to the upper electrode 109 of the high-frequency signal line 303. That is, the magnetization of the first ferromagnetic layer 101A can be vibrated using at least one of the high-frequency magnetic field, the spin transfer torque, and the spin orbit torque.

Like the high-frequency device 250, the high-frequency device 270 can function as a high-frequency device such as a high-frequency filter, a phase shifter, and an amplifier.

In Application Examples 1 and 2, the DC application terminal 119 may be connected between the inductor 125 and the ground G or may be connected between the upper electrode 109 and the ground G.

In addition, a resistance element may be used in place of the inductor 125 in Application Examples 1 and 2. The resistance element has a function of cutting out a high-frequency component of a current using a resistance component. The resistance element may be either a chip resistor or a resistor with a pattern line. The resistance value of the resistance element is preferably equal to or larger than a characteristic impedance of the output signal line 122. For example, when the characteristic impedance of the output signal line 122 is 50Ω and the resistance value of the resistance element is 50 Ω, 45% of high-frequency power can be cut by the resistance element. In addition, when the characteristic impedance of the output signal line 122 is 50Ω and the resistance value of the resistance element is 500Ω, 90% of high-frequency power can be cut by the resistance element. In this case, an output signal output from the magnetoresistance effect element 101 can efficiently flow to the second port 121.

In addition, in Application Examples 1 and 2, when the power supply 127 connected to the DC application terminal 119 has a function of cutting out a high-frequency component of a current and also passing an invariant component of a current, the inductor 125 may be omitted. In this case, an output signal output from the magnetoresistance effect element 101 can efficiently flow to the second port 121.

According to the present disclosure, it is possible to apply a magnetic field with a large strength to a magnetoresistance effect element and reduce the resistance in a high-frequency signal line.

While preferred embodiments of the disclosure have been described and shown above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims.

What is claimed is:

1. A magnetoresistance effect device comprising:
a magnetoresistance effect element including a first ferromagnetic layer, a second ferromagnetic layer and a spacer layer; and
a high-frequency signal line,
wherein in the magnetoresistance effect element, the first ferromagnetic layer, the second ferromagnetic layer, and the spacer layer are stacked such that the spacer layer is disposed between the first ferromagnetic layer and the second ferromagnetic layer,
the high-frequency signal line includes an overlapping part disposed at a position overlapping the magnetoresistance effect element and a non-overlapping part disposed at a position not overlapping the magnetoresistance effect element in a plan view from a stacking direction,
at least a part of the non-overlapping part is formed to be thicker than at least a part of the overlapping part, and
a distance in the stacking direction between a virtual plane including a surface on the side of the overlapping part of the first ferromagnetic layer and a center line in the high-frequency signal line in the stacking direction is shorter in at least a part of the overlapping part than in at least a part of the non-overlapping part.

2. The magnetoresistance effect device according to claim 1 comprising
a pad part which is electrically connected to the high-frequency signal line and of which at least a part of an end surface is exposed so that it is able to be electrically connected to the outside.

3. The magnetoresistance effect device according to claim 2, further comprising
a magnetic field applying unit configured to apply a magnetic field to the magnetoresistance effect element,
wherein the magnetic field applying unit is disposed on the side opposite to the magnetoresistance effect element with the high-frequency signal line therebetween and the pad part is disposed in an area not overlapping the magnetic field applying unit in a plan view from the stacking direction.

4. A magnetoresistance effect device comprising:
a magnetoresistance effect element including a first ferromagnetic layer, a second ferromagnetic layer and a spacer layer; and
a high-frequency signal line,
wherein in the magnetoresistance effect element, the first ferromagnetic layer, the second ferromagnetic layer, and the spacer layer are stacked such that the spacer layer is disposed between the first ferromagnetic layer and the second ferromagnetic layer,
the high-frequency signal line includes an overlapping part disposed at a position overlapping the magnetoresistance effect element and a non-overlapping part disposed at a position not overlapping the magnetoresistance effect element in a plan view from a stacking direction,
at least a part of the non-overlapping part is formed to be thicker than at least a part of the overlapping part, and
the high-frequency signal line has, at at least a part of the non-overlapping part, a protrusion that protrudes to a level above at least a part of the overlapping part in the stacking direction, assuming that the overlapping part is positioned above the magnetoresistance effect element in the stacking direction.

5. The magnetoresistance effect device according to claim 4, comprising
a pad part which is electrically connected to the high-frequency signal line and of which at least a part of an end surface is exposed so that it is able to be electrically connected to the outside.

6. The magnetoresistance effect device according to claim 5, further comprising
a magnetic field applying unit configured to apply a magnetic field to the magnetoresistance effect element,
wherein the magnetic field applying unit is disposed on the side opposite to the magnetoresistance effect element with the high-frequency signal line therebetween and the pad part is disposed in an area not overlapping the magnetic field applying unit in a plan view from the stacking direction.

* * * * *